(12) United States Patent
Lin

(10) Patent No.: US 6,246,223 B1
(45) Date of Patent: *Jun. 12, 2001

(54) METHOD FOR USE ON A PARAMETRIC TESTER TO MEASURE THE OUTPUT FREQUENCY OF A RING OSCILLATOR THROUGH VOLTAGE SAMPLING

(75) Inventor: Shi-Tron Lin, Taipei (TW)

(73) Assignee: Winbond Electronics Corp., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/984,886

(22) Filed: Dec. 4, 1997

(30) Foreign Application Priority Data

Aug. 20, 1997 (TW) .................................. 86111885

(51) Int. Cl.$^7$ ..................................................... G01R 23/02
(52) U.S. Cl. ..................................... 324/76.39; 324/76.42; 324/76.48
(58) Field of Search .............................. 324/76.15, 76.16, 324/76.39, 76.42, 76.48, 76.58, 76.62, 763, 158.1

(56) References Cited

U.S. PATENT DOCUMENTS

| | | | |
|---|---|---|---|
| 4,142,146 | * 2/1979 | Schumann et al. | 324/76.15 |
| 4,651,089 | * 3/1987 | Haigh | 324/76.42 |
| 4,721,855 | * 1/1988 | Fazekas | 250/310 |
| 4,779,044 | * 10/1988 | Skolnick et al. | 324/76.24 |
| 5,084,669 | * 1/1992 | Dent | 324/76.82 |
| 5,095,267 | * 3/1992 | Merrill et al. | 324/763 |
| 5,529,068 | * 6/1996 | Hoenninger et al. | 128/653.2 |
| 5,530,367 | * 6/1996 | Bottman | 324/616 |
| 5,638,005 | * 6/1997 | Rajan et al. | 324/751 |

* cited by examiner

Primary Examiner—Safet Metjahic
Assistant Examiner—Vincent Q. Nguyen
(74) Attorney, Agent, or Firm—Rabin & Champagne, P.C.

(57) ABSTRACT

A method is provided for use on a parametric tester that allows the parametric tester to more effectively and precisely measure the output frequency of a periodic pulse signal generating means. The first step is to down convert the output frequency of the periodic pulse signal generating means to about 1 Hz. Then, the frequency-downconverted pulse train is sampled to thereby obtain a series of sampled signals In accordance with the magnitudes of the sampled signals, the sampled signals are registered to be at either a high-level state, an low-level state, or a intermediate-level state. Then, the integration time and the delay time involved in the sampling process are registered. The sampling process is continued until at least two sampled signals at the low-level state are registered. Based on these parameters, a delta transition time for the first intermediate-level state and a second delta transition time for the second intermediate-level state can be obtained. Further, the length of the period from the occurrence of the first intermediate-level state to the occurrence of the second intermediate-level state is computed based on the number of the occurrences of pulse transitions during this period. Based on the foregoing parameters, the frequency of the frequency-downconverted pulse train can be obtained, which then allows the output frequency of the periodic pulse signal generating means to be obtained.

31 Claims, 3 Drawing Sheets

METHOD FOR USE ON A PARAMETRIC TESTER TO MEASURE THE OUTPUT FREQUENCY OF A RING OSCILLATOR THROUGH VOLTAGE SAMPLING

BACKGROUND OF THE INVENTION

1. Field of the Invention

This invention relates in general to methods for measuring the frequency of periodic square pulse trains, and more particularly, to a method, for use on a parametric tester having a slow integration time and a slow delay time, to measure the output frequency of a ring oscillator through voltage sampling, which allows the output frequency of the ring oscillator to be more effectively and precisely measured.

2. Description of Related Art

A parametric tester is also referred as a wafer acceptance tester (WAT), which is basically composed of a probe station, a switch matrix, a voltage sourcing/measurement unit (SMU), and a computer means for control of the test programs and data acquisition. The parametric tester is widely used in semiconductor industry for the purpose of collecting lot-to-lot data that are used for statistical analysis on variations in the fabrication processes and performances of the fabricated semiconductor devices. The analysis can help engineers to optimize the design of process windows.

The parametric tester is also useful for measuring the output frequency of a ring oscillator which is fabricated on a semiconductor chip. The collected frequency data are related to the performance of the ring oscillator. One problem in the frequency measurements of ring oscillators is that the integration time and delay time are relatively lengthy, so as to make the measurement difficult to carry out.

FIG. 1 is a schematic block diagram of a system setup for a parametric tester (represented by a block indicated by the reference numeral 10) to measure the output frequency of a ring oscillator (represented by a block indicated by the reference numeral 102). The parametric tester 10 includes a switch matrix 108 and an SMU 110. The ring oscillator 102 is a closed loop circuit composed of a series of inverters (not shown) capable of generating a signal (which is typically a periodical square pulse train) having output frequency 103 in a range from several kilohertz to several megahertz. The waveform with the output frequency 103 can be visualized by using an oscilloscope. The exact value of the output frequency 103 is dependent on the characteristics of the transistors used to constitute the ring oscillator 102 on the semiconductor chip. The on-chip ring oscillator is a useful tool for the calibration of transistor mode in circuit designs.

The signal with output frequency 103 is first transferred to a buffer 104, and then to a frequency divider 106 that is capable of dividing the signal with output frequency 103 by a predetermined factor to obtain a reduced output frequency 107. The frequency divider 106 is composed of a plurality of D-type flip-flops (not shown). A 7-decade frequency divider can down convert a 5 MHz (period is $2 10^{-7}$ sec.) pulse train to a reduced frequency as low as 1 Hz.

The frequency-downconverted pulse train 107 is then transferred via the switch matrix 108 to the SMU 110 in the parametric tester 10. The SMU 110 then measures the frequency of the received pulse train.

One drawback to the foregoing parametric tester, however, is that, at the start of the sampling process on the received pulse train, there will be an initial delay time $T_d$ and subsequently an integration time $T_g$ (which is equal to one sampling period), and both are larger than the rising/falling transition time $T_r$ of the received pulse train. For instance, in a typical case, $T_d$ is 5 msec (millisecond) and $T_g$ is 50 msec, while $T_r$ is 10 μsec (microsecond). Due to these two factors, even though the output frequency 103 from the ring oscillator 102 can be lowered by the frequency divider 106 to a reduced value of 1 Hz, it is nonetheless difficult for the parametric tester 10 to precisely measure the output frequency of the ring oscillator 102.

SUMMARY OF THE INVENTION

It is therefore an objective of the present invention to provide a method for use on a parametric tester that allows the parametric tester to more effectively and precisely measure the output frequency of a ring oscillator.

In accordance with the foregoing and other objectives of the present invention, a method is provided for use of a parametric tester to more effectively and precisely measure the output frequency of a ring oscillator. The method is used on a parametric tester to measure the output frequency of a ring oscillator that outputs a periodic square pulse train.

In the first step, the ring oscillator generates a periodic square pulse train $V_O$ having a frequency f. This output frequency f is then transferred to a frequency divider.

In the second step, a suitable integer K is selected that causes the frequency divider to divide the output frequency f by a factor of $2^K$ to obtain a frequency-downconverted pulse train $V_K$. Subsequently, the frequency-downconverted pulse train $V_K$ is transferred to the SMU of the parametric tester.

In the third step, a sampling process is performed by the parametric tester on the frequency-downconverted pulse train to thereby obtain a series of sampled signals $V_S$. Meanwhile, the integration time $T_g$, delay time $T_d$, and sampling period $T_s$ are registered. The sampling period $T_s$ is the total duration of the delay time Td and the integration time $T_g$.

In the fourth step, the sampled signals are classified in accordance with their magnitudes into three states: a high-level state, an intermediate-level state, and a low-level state. The sampling process continues until at least two sampled signals at the intermediate-level state are obtained, which are respectively designated by $M_1$ and $M_2$.

In the fifth step, a delta transition time $T_1$ for the first intermediate-level state is computed based on the magnitude of the first intermediate-level state $M_1$, the integration time $T_g$, and the maximum amplitude of the frequency-downconverted pulse train $V_K$.

In the sixth step, a delta transition time $T_2$ for the second intermediate-level state is computed based on the magnitude of the second intermediate-level state $M_2$, the integration time $T_g$, and the maximum amplitude of the frequency-downconverted pulse train $V_K$.

In the seventh step, the number N of pulse state transitions from one state to the other during the $M_1$ to $M_2$ period is counted.

In the eight step, the length of the $M_1$ to $M_2$ period is computed.

In the ninth step, the frequency $f_L$ of the frequency-downconverted pulse train $V_K$ is computed.

In the tenth step, the output frequency f of the ring oscillator under measurement is computed.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1:
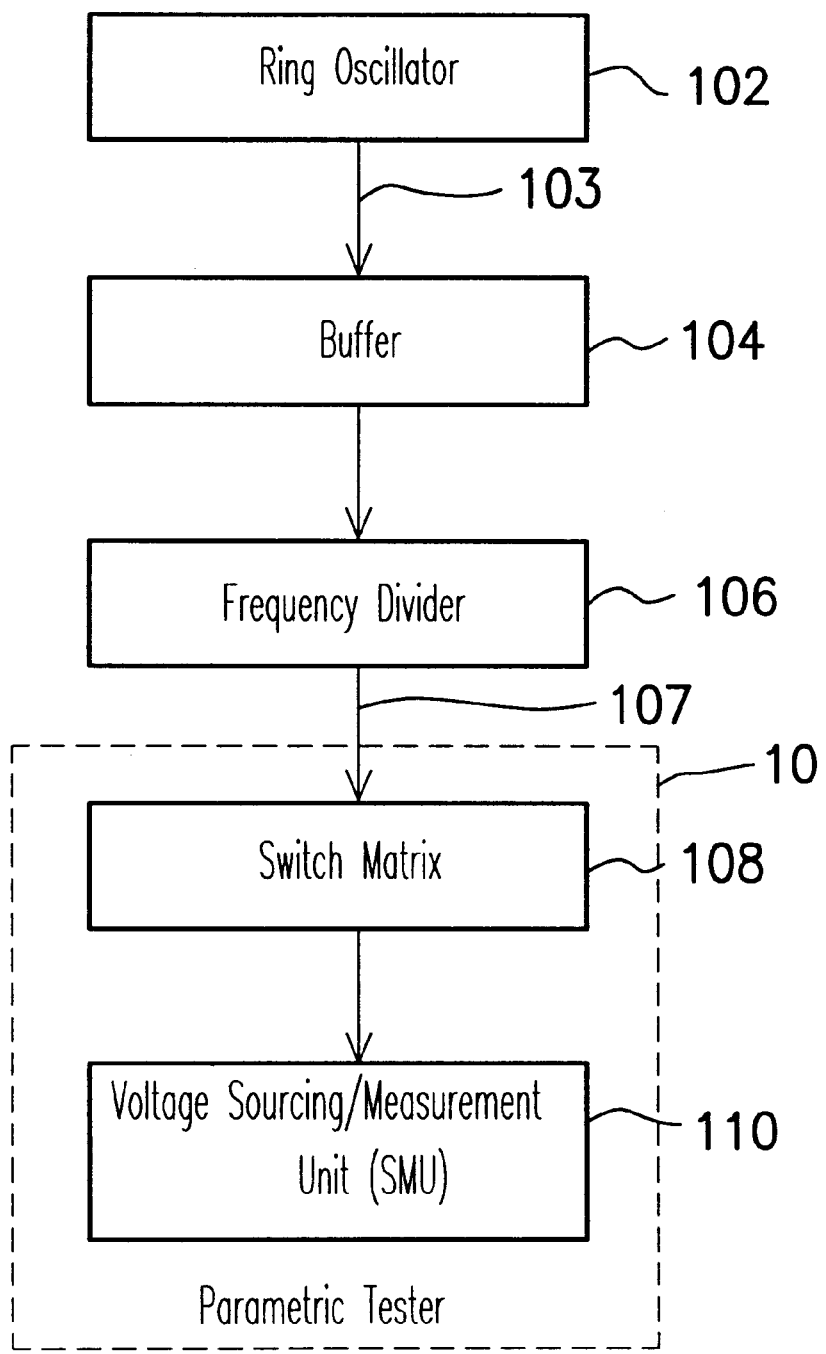
FIG. 1 is a schematic block diagram of a conventional system setup for a parametric tester to measure the output frequency of a ring oscillator through voltage sampling.
Figure 2:
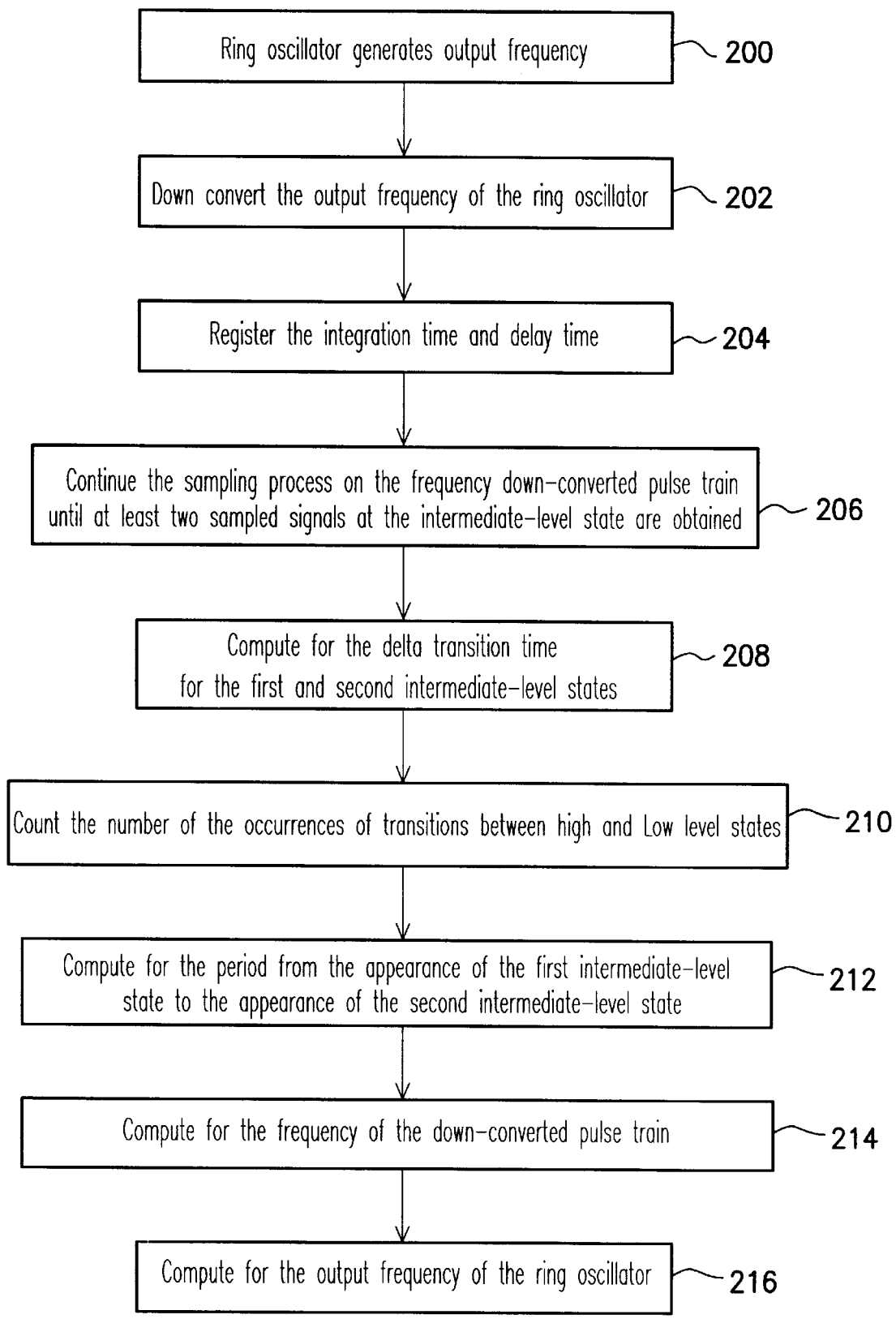
FIG. 2 is a flow diagram showing the procedural steps involved in the method according to the invention carried out by a parametric tester to measure the output frequency of a ring oscillator.

FIG. 2 is a flow diagram showing the procedural steps involved in the method according to the invention carried out by a parametric tester to measure the output frequency f of a periodic pulse signal generating means, such as a ring oscillator. The system setup for the parametric tester and the ring oscillator, is substantially identical to that shown in FIG. 1.

As shown, in the first step 200, the ring oscillator generates and outputs a periodic square pulse train $V_O$ whose frequency f is in the range from 100 KHz (kilohertz) to 1 MHz (megahertz) having a maximum amplitude $V_H$ and a minimum amplitude $V_L$. This pulse train of frequency f is then sent to a frequency divider which is of the type constituted with a closed loop of a plurality of serially connected inverters. The output pulse train f is a series of sampled outputs from a DC input voltage and a zero-volt voltage that are input to the ring oscillator; thus the maximum amplitude $V_H$ of the output pulse train is equal to the magnitude of the DC input voltage and the minimum amplitude $V_L$ is equal to the zero-volt input voltage.

In the next step 202, the pulse train $V_O$ is divided by the frequency divider into a low-frequency signal (hereinafter referred to as frequency-downconverted pulse train). The frequency divider is, for example, of the type constituted with D-type flip-flops. A 7-decade frequency divider can convert an output frequency f of 5 MHz from the ring oscillator down to about 1 Hz (or in the range from 0.5 Hz to 2 Hz). The frequency-downconverted pulse train from the frequency divider is hereinafter designated by $V_k$ having a reduced frequency $f_L$. The maximum and minimum amplitudes of the frequency-downconverted pulse train $V_K$, however, are not changed and thus are still designated by $V_H$ and $V_L$ respectively. The frequency divisor of the frequency divider is represented by $2^K$, in which the power K is a variably adjustable integer. Thus, increasing K by one will cause the width of the pulses in the output of the frequency divider (i.e., the frequency-downconverted pulse train $V_K$) to be doubled while decreasing the frequency of the same by a factor of ½.

Figure 3A:
FIGS. 3A through 3D are waveform diagrams used to depict how the output frequency of a ring oscillator is frequency downconverted and then sampled in a manner according to the method of the invention.
Figure 3B:
Figure 3C:

FIGS. 3A through 3C illustrate the effects of varying the value of K, in which $V_{K-n}$ denotes a pulse train obtained by down-converting the output frequency f by a factor of $2^{K-n}$. As shown, when the value of K is increased by one, the pulse width of the resultant pulse train is doubled and the frequency of the same is reduced in half. Therefore, by selecting a suitable value for K, the frequency f of the pulse train output from the ring oscillator can be down-converted to about 1 Hz (or within the range from 0.5 Hz to 2 Hz), as represented by the pulse train $V_K$ shown in FIG. 3D. The selected value of K is related to the output frequency f as follows:

$$2^{K-1} < f < 2^K$$

In accordance with this relation, a suitable value of K can be selected that allows the output frequency f of the ring oscillator to be down-converted to within the above-mentioned range. The frequency-downconverted pulse train $V_K$ is then sent to the SMU of the parametric tester.

Figure 3D:
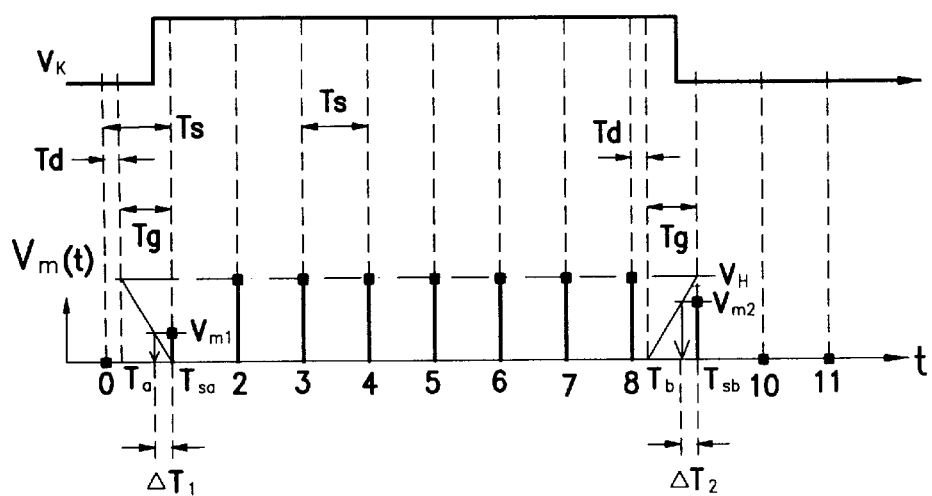

Referring to FIG. 3D together with FIG. 2, in the subsequent step 204, the SMU of the parametric tester samples the frequency-downconverted pulse train $V_K$ from the frequency divider to obtained a series of sampled signals $V_S$, and meanwhile detects and registers the integration time $T_g$ (which is about 50 msec to 100 msec), the delay time $T_d$, and the sampling period $T_s$ in the sampling process.

The delay time $T_d$ and the integration time $T_g$ in the sampling process are, as mentioned in the background section of this specification, greater than the rising/falling transition time $T_r$ of the frequency-downconverted pulse train $V_K$. The delay time $T_d$ is results from the command execution time by the computer means of the test system, and the response time of the SMU of the parametric tester. The sampling period $T_s$ is the total duration of the delay time $T_d$ and the integration time $T_g$, i.e., $$T_s = T_d + T_g$$

In the next step 206, the frequency-downconverted pulse train $V_K$ from the frequency divider is sampled by the SMU of the parametric tester to thereby produce a series of sampled signals $V_S$. The magnitude of each of the sampled signals $V_S$ designated by $V_m$ is detected.

In accordance with the preferred embodiment of this invention, if the magnitude of a sampled signal $V_S$ is equal to or greater than $0.9V_H$, it is regarded as at a high-level state; if equal to or less than $0.1V_H$, it is regarded as at low-level state L; and if it lies between $0.1V_H$ and $0.9V_H$ ($0.1V_H < V_m < 0.9V_H$), it is regarded as at an intermediate-level state M.

The sampled signal magnitude $V_m$ is related to the frequency-downconverted pulse train $V_K$ as follows:

(1) When the frequency-downconverted pulse train $V_K$ is at the maximum amplitude, the sampled signal $V_S$ will be registered as at the high-level state H; and when the frequency-downconverted pulse train $V_K$ is at the minimum amplitude (i.e., zero-volt state), the sampled signal $V_S$ will be registered as at the low-level state L.

(2) When the frequency-downconverted pulse train $V_K$ is rising, if the rising edge (i.e., the transition from minimum amplitude state to maximum amplitude state) occurs within the delay time $T_d$, the currently obtained sampled signal $V_S$ will be registered as at the high-level state H; whereas if the transition occurs within the integration time $T_g$, the currently obtained sampled signal $V_S$ will be registered as: (i) at the high-level state H, if $V_m \geq 0.9V_H$; (ii) at the intermediate-level state M, if $0.1V_H < V_m < 0.9V_H$; and (iii) at the low-level state L, if $V_m \leq 0.1V_H$. The temporal point $T_a$ when this transition (a rising edge) occurs, can be obtained in accordance with the following equation:

$$T_a = T_{sa} - T_g (V_m / V_H)$$

wherein $T_{sa}$ is the temporal point at the end of the sampling period during which the rising edge occurs;

$T_g$ is the integration time;

$V_m$ is the magnitude of the currently obtained sampled signal; and $V_H$ is the maximum amplitude of the frequency-downconverted pulse train $V_K$.

(3) When the frequency-downconverted pulse train $V_K$ is falling, if the falling edge (i.e., the transition from maximum amplitude state to minimum amplitude state) occurs within the delay time $T_d$, the currently obtained sampled signal $V_S$ will have a magnitude near zero-volt point which is registered as at the low-level state L; whereas if the falling edge occurs within the integration time $T_g$, the currently obtained sampled signal $V_S$ will be registered as: (i) at the high-level state H, if $V_m \geq 0.9 V_H$; (ii) at the intermediate-level state M, if $0.1 V_H < V_m < 0.9 V_H$; and (iii) at the low-level state L, if $V_m \leq 0.1 V_H$. The temporal point $T_b$ when this transition (a falling edge) occurs, can be obtained in accordance with the following equation:

$$T_b = T_{sb} - T_g (1 - V_m/V_H)$$

wherein $T_{sb}$ is the temporal point at the end of the sampling period during which the falling edge occurs;

$T_g$ is the integration time;

$V_m$ is the magnitude of the currently obtained sampled signal; and $V_H$ is the maximum amplitude of the frequency-downconverted pulse train $V_K$.

It is to be noted that, during the foregoing sampling process on the frequency-downconverted pulse train $V_K$, since the rising/falling transition time $T_r$ is far smaller than the delay time $T_d$ and the integration time $T_g$, at most one intermediate-level state M will be obtained during each sampling period $T_s$.

In this step 206, the state of each of the successively obtained sampled signals is registered until two sampled signals are registered to be at the intermediate-level state M. Again, the first sampled signal at the intermediate-level state is designated by $M_1$ and the second one is designated by $M_2$.

Then the next step 208, the delta transition time $T_1$ of the first intermediate-level state $M_1$ is calculated in accordance with the following:

(1) if the pulse transition is a rising edge of the frequency-downconverted pulse train $V_K$ (i.e., $LM_1H$), then $$T_1 = T_g(V_{m1}/V_H),$$

otherwise (2) if the pulse transition is a falling edge of the frequency-downconverted pulse train $V_K$ (i.e., $HM_1L$), then $$T_1 = T_g(1 - V_{m1}/V_H),$$

where $V_{m1}$ is the magnitude of the first intermediate-level state $M_1$.

Further, the delta transition time $T_2$ of the second intermediate-level state $M_2$ is calculated in accordance with the following:

(1) if the pulse transition is a rising edge of the frequency-downconverted pulse train $V_K$ (i.e., $LM_2H$), then $$T_2 = T_g(V_{m2}/V_H),$$

otherwise (2) if the pulse transition is a falling edge of the frequency-downconverted pulse train $V_K$ (i.e., $HM_2L$), then $$T_2 = T_g(1 - V_{m2}/V_H),$$

where $V_{m2}$ is the magnitude of the second intermediate-level state $M_2$.

In the subsequent step 210, the number of the occurrences of the transitions from high-level state H to low-level state L (HL) and from low-level state L to high-level state H (LH) during the period from the occurance of the first intermediate-level state $M_1$ to the occurance of the second intermediate-level state $M_2$ is detected and registered. The number N represents that during the period $M_1$ to $M_2$, a number $(N+1)/2$ of sampling periods have occurred.

In the subsequent step 212, the period $T_m$ from the occurrence of the first intermediate-level state $M_1$ to the occurrence of the second intermediate-level state $M_2$, is calculated. Assuming that the first intermediate-level state $M_1$ occurs at the (i)th sampling point, and that the second intermediate-level state $M_2$ occurs at the (j)th sampling point, then $T_m$ is obtained as follows:

$$T_m = (j-i)T_s + T_1 - T_2,$$

wherein $T_1 - T_2$ is designated hereinafter as a "delta time," that is the fractional segment by which $T_m$ differs from a whole number of sampling periods $T_s$.

For example, assume in one case the following series of the states of the sampled signals are obtained:

$$HHM_1LLLLHHHHLLLLM_2HHH$$

Then, since there are two transitions of states (the first from L to H and the second from H to L) during the $M_1$ to $M_2$ period, it can be obtained that N=2; and since the first intermediate-level state $M_1$ occurs at the 3rd sampling point while the second intermediate-level state $M_2$ occurs at the 16th sampling point, it can be obtained that i=3 and j=16.

In the next step 214, the frequency of the frequency-downconverted pulse train $V_K$ can be obtained in accordance with the following equation:

$$f_L = 0.5(N+1)/T_m$$

Further, in the next step 216, the output frequency f of the ring oscillator under measurement can be obtained in accordance with the following equation:

$$f = f_L 2^K$$

where $2^K$, as mentioned earlier, is the frequency divisor of the frequency divider by which the output frequency f of the ring oscillator has been divided at the initial stage.

In conclusion, a first aspect of the invention is to down convert the output frequency of the ring oscillator under measurement by a frequency divider to a reduced frequency that allows easy sampling of the resultant low-frequency pulse train into a high-level state, an intermediate-level state, and a high-level state.

A second aspect of the invention is to count the number of the occurrences of the transitions from high-level state to low-level state and from low-level state to high-level state, that have occurred during the period from the occurrence of the first intermediate-level state to the occurrence of the second intermediate-level state.

A third aspect of the invention is that the delta transition time of the intermediate-level state can be calculated in accordance with the sampled signal magnitude, the integration time, and the voltage level on the bus.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for measuring the frequency of a periodic pulse train based on multiple samples of the voltage of the pulse train, the voltage samples having a predetermined integration time, the method comprising:

repeatedly sampling the voltage of the pulse train until at least a first sample and a second sample, each containing a pulse transition, are obtained;

determining the duration of time between when the first sample is obtained and when the second sample is obtained;

determining a delta time equal to a difference between the portion of the predetermined integration time of the first sample that follows the pulse transition thereof and the portion of the predetermined integration time of the second sample that follows the pulse transition thereof, based on a first voltage level of the first sample, is a second voltage level of the second sample and a voltage level representative of pulse peaks repetitively reached by the pulses of the pulse train; and computing either the frequency or the period of the pulse train based on the sum of the determined duration of time and the determined delta time.

2. The method of claim 1, wherein the periodic pulse train is a train of square pulses.

3. The method of claim 1, further including counting the number of pulse transitions during the period of time between when the first sample is obtained and when the second sample is obtained, wherein the computing the frequency of the pulse train is based on the voltage of the first sample, the voltage of the second sample, the determined duration of time and the counted number of pulse transitions.

4. The method of claim 1, wherein the pulse train is a frequency-downconverted pulse train, further comprising frequency-downconverting, by a down-conversion ratio, a high frequency pulse train to the frequency-downconverted pulse train; and deriving the frequency of the high frequency pulse train from the computed frequency of the frequency-downconverted pulse train, based on the down-conversion ratio.

5. The method of claim 4, further comprising generating the high frequency pulse train at the output of a ring oscillator of an integrated circuit.

6. The method of claim 1, wherein the repeatedly sampling the voltage of the pulse train, the determining the duration of time and the computing the frequency of the pulse train are performed with a parametric tester.

7. The method of claim 1, wherein for the first sample having a voltage $V_{m1}$ and being obtained at a time $T_{5a}$ and the second sample having a voltage $V_{m2}$ and being obtained at a time $T_{5b_1}$ the method further comprising:

determining, based on the voltage $V_{m1}$, a first delta transition time $T_1$ between a time that the pulse transition occurs during the integration time of the first sample, and the end of the integration time of the first sample;

determining, based on the voltage $V_{m2}$, a second delta transition time $T_2$ between a time that the pulse transition occurs during the integration time of the second sample, and the end of the integration time of the second sample;

determining a period of time T equal to $T_{m2}-T_{m1}+T_2-T_1$; and determining the frequency of the pulse train as 1/T.

8. The method of claim 1, wherein the pulses of the pulse train consist substantially of pulses of equal amplitude, and the pulse peaks repetitively reached are the amplitudes of the pulses.

9. The method of claim 1, wherein the voltage level representative of pulse peaks is a maximum voltage level of the samples of the pulse train, obtained during said repeated sampling.

10. The method of claim 1, further comprising classifying the voltage samples among high, low and intermediate states, according to the magnitudes of the voltage samples.

11. The method of claim 10, wherein said repeatedly sampling the voltage of the pulse train includes repeatedly sampling the voltage of the pulse train until at least one of the first sample and the second sample, each containing a pulse transition, is classified in the intermediate state.

12. The method of claim 1, further comprising classifying the voltage samples among high, low and intermediate states according to the magnitudes of the voltage samples, such that (i) a voltage sample is classified in the high state whenever the magnitude of the voltage sample is not less than a predetermined high-level; (ii) a voltage sample is classified in the low state whenever the magnitude of the voltage sample is not greater than a predetermined low-level; and (iii) a voltage sample is classified in the intermediate state whenever the magnitude of the voltage sample is less than the predetermined high-level and greater than the predetermined low-level.

13. The method of claim 12, wherein the pulses of the pulse train have a predetermined maximum voltage level and the high-level is equal to nine-tenths of the maximum voltage level and the low-level is equal to one-tenth of the maximum voltage level.

14. The method of claim 1, further comprising determining the number of pulse transitions during the period of time between when the first sample is obtained and when the second sample is obtained, wherein the repeatedly sampling has a sampling period, and wherein the determining the duration of time includes determining the duration of time based on the determined number of pulse transitions and the sampling period.

15. The method of claim 14, wherein the sampling period includes a predetermined delay time.

16. The method of claim 15, wherein the sampling period is equal to the sum of the integration time and the delay time.

17. A method of measuring the frequency of a periodic pulse train, said method comprising:

repeatedly sampling magnitudes of the pulse train at a predetermined sampling period to thereby obtain a series of samples;

in accordance with the magnitudes of the samples, registering each of the samples to be either at a high-level state, an intermediate-level state, or a low-level state;

continuing the sampling at least until a first and a second sample are registered to be at the intermediate-level state;

obtaining a first delta transition time between a time that a pulse transition occurs during the integration time of the first sample at the intermediate-level state, and the end of the integration time of the first sample;

obtaining a second delta transition time between a time that a pulse transition occurs during the integration time of the second sample at the intermediate-level state, and the end of the integration time of the second sample;

obtaining a state-to-state time duration from the occurrence of the first sample at the intermediate-level state to the occurrence of the second sample at the intermediate-level state; and computing the frequency of the periodic pulse train based on the obtained first and second delta transition times and the obtained state-to-state time duration.

18. The method of claim 17, further comprising:

counting the number of pulse transitions during the period from the occurrence of the first sample at the intermediate-level state to the occurrence of the second sample at the intermediate-level state;

obtaining the duration of the transition-to-transition time period from the occurrence of a first pulse transition corresponding to the first sample at the intermediate-level state to the occurrence of a second pulse transition corresponding to the second sample at the intermediate-level state, based on the first delta transition time, the second delta transition time and the obtained state-to-state time duration; and computing either the frequency or the period of the pulse train based on the obtained duration of the transition-to-transition time period and the number of pulse transitions counted during said counting.

19. The method of claim 18, further comprising frequency-downconverting a periodic pulse output of a periodic pulse generator by a down-conversion ratio to obtain the periodic pulse train measured, as a frequency-downconverted periodic pulse having a reduced frequency below the frequency of the generator output; and deriving the frequency of the high frequency pulse train from the computed frequency of the frequency-downconverted pulse train, based on the down-conversion ratio.

20. The method of claim 17, wherein the periodic pulse signal generator is a ring oscillator including a plurality of serially connected inverters.

21. The method of claim 20, wherein the samples are voltage samples and the high-level state is a state in which the sample voltage is equal to or greater than 0.9 of the maximum amplitude of the frequency-downconverted pulse train, the intermediate-level state is a state in which the sample voltage is between 0.1 and 0.9 of the maximum amplitude of the frequency-downconverted pulse train and the low-level state is a state in which the sample voltage is equal to or lower than 0.1 of the maximum amplitude of the frequency-downconverted pulse train.

22. The method of claim 17, further comprising performing the measuring with a parametric tester.

23. The method of claim 22, further comprising frequency-downconverting a periodic pulse output of a periodic pulse generator to obtain the periodic pulse train measured by the parametric tester having a reduced frequency below the frequency of the generator.

24. The method of claim 22, wherein the sampling period includes a delay time and the integration time, each determined by the parametric tester, further comprising registering the delay time and the integration time.

25. The method of claim 17, wherein the periodic pulse train is a periodic square pulse train.

26. A method of measuring the output frequency of a periodic pulse train output by a periodic pulse signal generator, comprising:

down-converting the output frequency of the periodic pulse signal generator by a predetermined factor to thereby obtain a frequency-downconverted pulse train;

sampling the frequency-downconverted pulse train at a sampling period into a series of sampled signals; and in accordance with the magnitudes of the sampled signals, registering the sampled signals as being at either a high-level state, an intermediate-level state, or a low-level state, wherein the sampling period includes a delay time and an integration time;

continuing the sampling until at least two sampled signals are registered at the intermediate-level state;

computing a first delta transition time between a time that a pulse transition occurs during the integration time of the first sampled signal at the intermediate-level state, and the end of the integration time of the first sampled signal for the first intermediate-level state;

computing a second delta transition time between a time that a pulse transition occurs during the integration time of the second sampled signal at the intermediate-level state, and the end of the integration time of the second sampled signal for the second intermediate-level state; and computing the output frequency of the periodic pulse signal generator based in part on the first and second delta transition times and the predetermined factor.

27. The method of claim 26, further comprising:

computing the number of the occurrences of transitions from the high-level state to the low-level state and from the low-level state to the high-level state during the period from the occurrence of the first intermediate-level state to the occurrence of the second intermediate-level state;

computing the length of the state-to-state time period from the occurrence of the first intermediate-level state to the occurrence of the second intermediate-level state; and computing the frequency of the frequency-downconverted pulse train based on the computed length of the state-to-state time period and the computed number of the occurrences of transitions.

28. The method of claim 26, wherein the sampled signals are voltage samples and the high-level state is a state in which a voltage sample therein is equal to or greater than 0.9 of the maximum amplitude of the frequency-downconverted pulse train, the intermediate-level state is a state in which a voltage sample therein is between 0.1 and 0.9 of the maximum amplitude of the frequency-downconverted pulse train and the low-level state is a state in which a voltage sample therein is equal to or lower than 0.1 of the maximum amplitude of the frequency-downconverted pulse train.

29. The method of claim 26, further comprising performing the measuring with a parametric tester.

30. The method of claim 26, wherein the periodic pulse train is a periodic square pulse train.

31. A method for measuring the frequency of a periodic pulse train based on multiple samples of the voltage of the pulse train, the voltage samples having a predetermined integration time, the method comprising:

repeatedly, during successive sampling periods of equal length greater than the integration time, sampling the voltage of the pulse train until at least a first sample and a second sample, each containing a pulse transition, are obtained;

determining the duration of time between when the first sample is obtained and when the second sample is obtained;

determining a delta time as a fractional portion of one sampling period, equal to the length of time by which the duration of time differs from the period of the pulse train, based on a first voltage level of the first sample, a second voltage level of the second sample, a voltage level representative of pulse peaks repetitively reached by the pulses of the pulse train a maximum voltage level of all samples taken during said repeatedly sampling, and the predetermined integration time; and computing either the frequency or the period of the pulse train based on the sum of the determined duration of time and the determined delta time.

* * * * *